(12) United States Patent
Watanabe (10) Patent No.: US 7,292,175 B2
(45) Date of Patent: Nov. 6, 2007

(54) METHOD OF TESTING A/D CONVERTER CIRCUIT AND A/D CONVERTER CIRCUIT

(75) Inventor: Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/407,211

(22) Filed: Apr. 20, 2006

(65) Prior Publication Data

US 2006/0238394 A1    Oct. 26, 2006

(30) Foreign Application Priority Data

Apr. 21, 2005    (JP)    ............. 2005-123718

(51) Int. Cl.
*H03M 1/60*    (2006.01)

(52) U.S. Cl. ................... 341/157; 341/155

(58) Field of Classification Search ............ 341/155, 341/157, 161; 327/161; 331/179; 356/5.1
See application file for complete search history.

(56) References Cited

U.S. PATENT DOCUMENTS

| | | | | |
|---|---|---|---|---|
| 5,396,247 | A * | 3/1995 | Watanabe et al. | 341/157 |
| 5,465,076 | A * | 11/1995 | Yamauchi et al. | 331/179 |
| 5,534,809 | A * | 7/1996 | Watanabe et al. | 327/269 |
| 6,653,964 | B2 * | 11/2003 | Mizuno et al. | 341/155 |
| 6,757,054 | B2 * | 6/2004 | Watanabe et al. | 356/5.1 |
| 6,771,103 | B2 * | 8/2004 | Watanabe et al. | 327/161 |
| 6,801,150 | B2 * | 10/2004 | Honda | 341/161 |
| 2003/0011502 | A1 * | 1/2003 | Watanabe | 341/157 |

FOREIGN PATENT DOCUMENTS

JP        H05-259907        10/1993

OTHER PUBLICATIONS

"D-A Converter", Basic Knowledge of Computer Terminology by CQ Publishing Co., Ltd., online at <URL:http://www.cqpub.co.jp/try/kijidb/yougo/ju.htm> (partial w/English translation), no date.

* cited by examiner

*Primary Examiner*—Jean Bruner Jeanglaude
(74) *Attorney, Agent, or Firm*—Posz Law Group, PLC (57) ABSTRACT

For testing an A/D converter circuit including a pulse delay circuit constituted by a plurality of cascade-connected delay units, and an encoding circuit configured to count the number of the delay units through which the input pulse signal passes within a predetermined measuring time and to output a digital signal representing the counted number, the method includes the steps of setting the A/D converter circuit in a test mode where the measuring time is set at a short test-use sampling period, applying the input pulse signal to each of serial delay blocks each of which is constituted by a predetermined number of the delay units, and determining good and bad of the A/D converter circuit on the basis of digital signals outputted from the encoding circuit representing the numbers of the delay units through which the input pulse signal has passed within each of the serial delay blocks.

7 Claims, 6 Drawing Sheets

METHOD OF TESTING A/D CONVERTER CIRCUIT AND A/D CONVERTER CIRCUIT

CROSS-REFERENCE TO RELATED APPLICATION

This application is related to Japanese Patent Application No. 2005-123718 filed on Apr. 21, 2005, the contents of which are hereby incorporated by reference.

BACKGROUND OF THE INVENTION

1. Field of the Invention

The present invention relates to a method of testing an A/D converter circuit, and the A/D converter circuit.

2. Description of Related Art

As known, for example, from "Basic Knowledge of Computer Terminology" by CQ Publishing Co. Ltd, online searched on Apr. 11, 2005 at <URL:http://www.cqpub.co.jp/try/kijidb/yougo/ju.htm>, the A/D converter circuit is mainly classified into "double integral type" as shown in FIG. 5, "sequential comparison type" as shown in FIG. 6A, and "parallel type" as shown in FIG. 6B.

Figure 5:
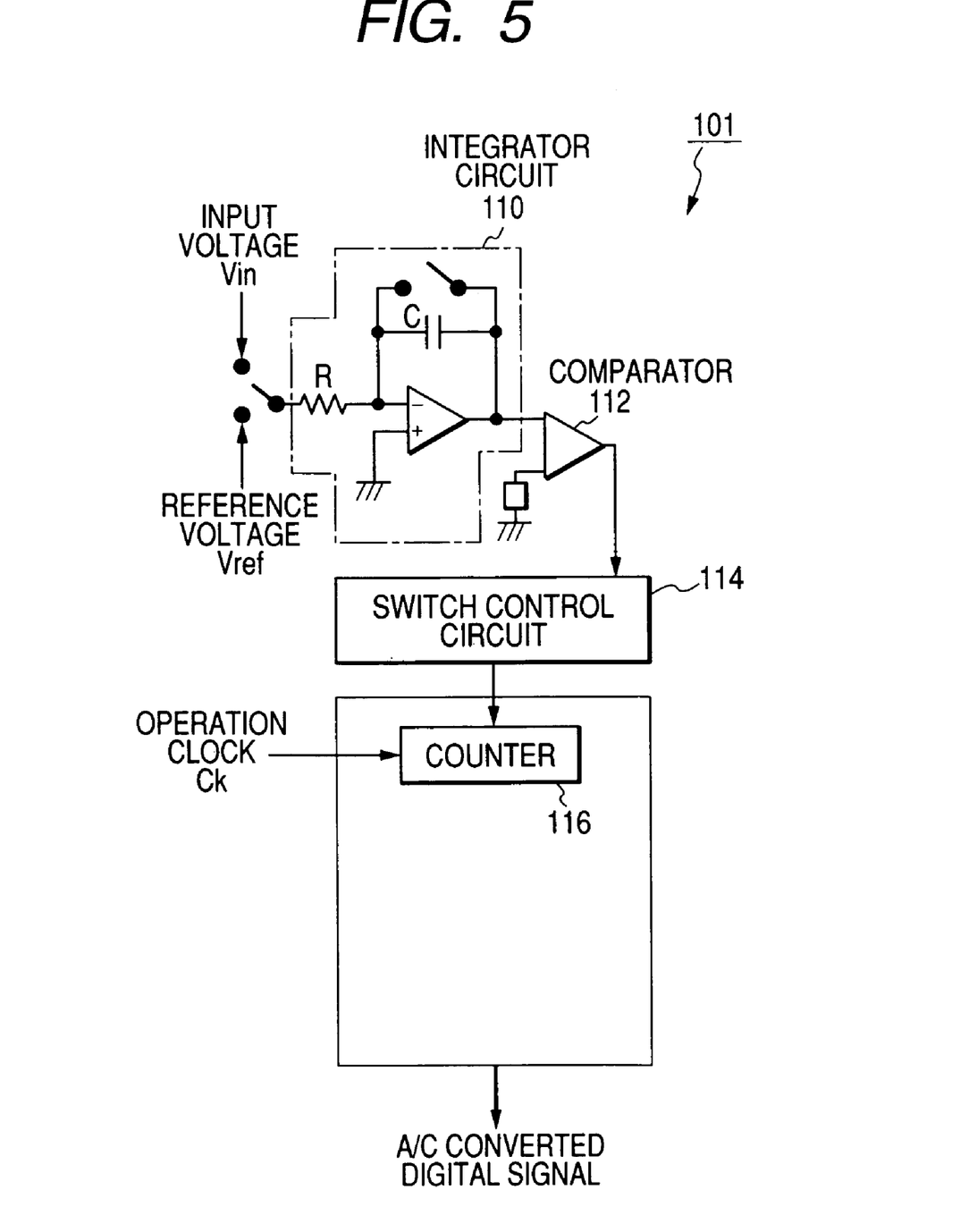
FIG. 5 is a diagram showing a structure of a conventional A/D converter circuit.
Figure 6A:
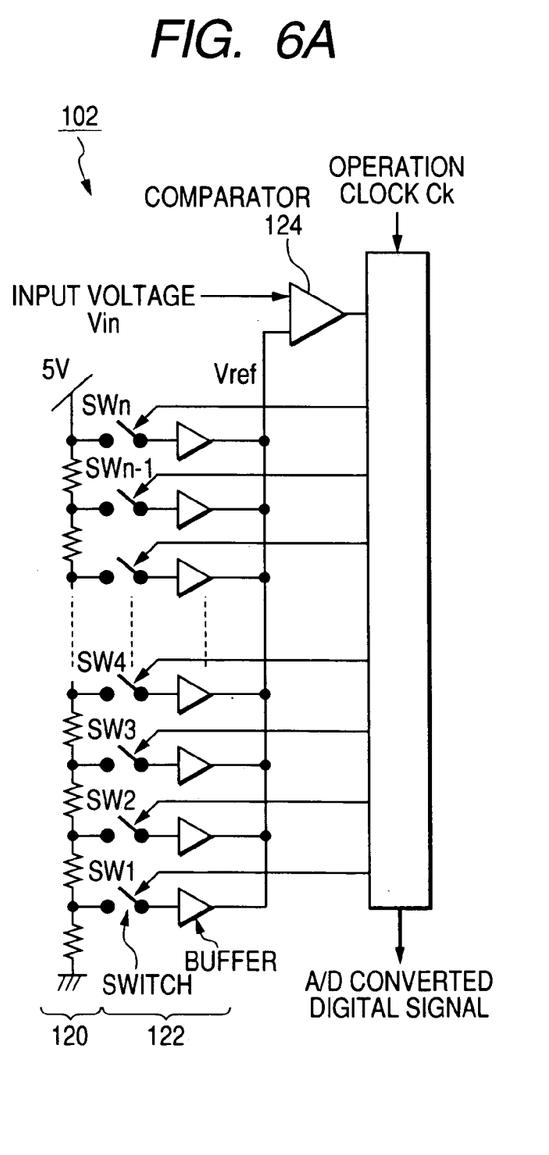
FIG. 6A is a diagram showing a structure of another conventional A/D converter circuit.
Figure 6B:
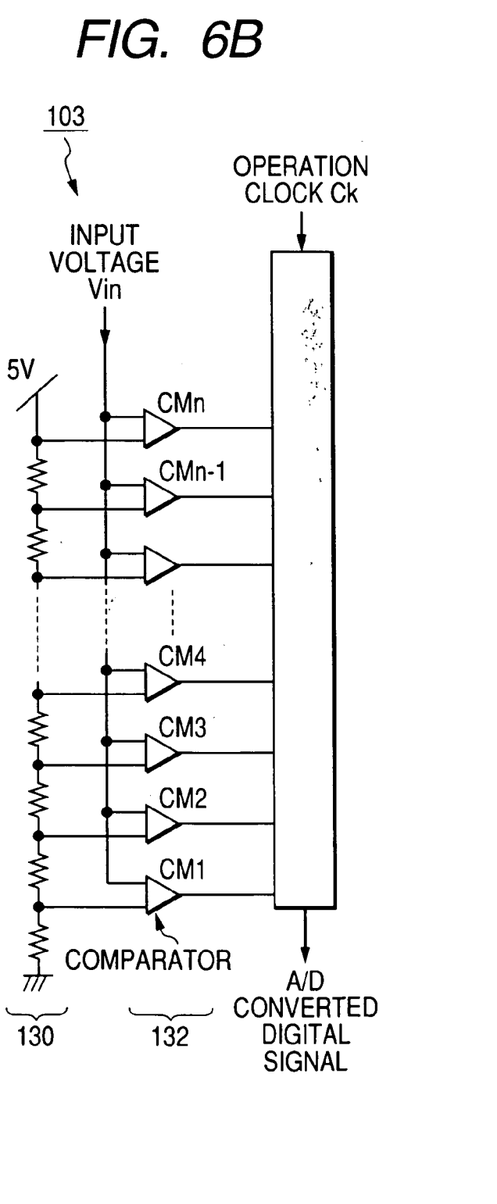
FIG. 6B is a diagram showing a structure of another conventional A/D converter circuit.

As shown in FIG. 5, the double integral type A/D converter circuit 101 includes an integration circuit 110 constituted mainly by an operational amplifier. A capacitor C connected between the inverting input terminal and the output terminal of the operational amplifier is charged by an input voltage Vin to be A/D converted for a predetermined time period, and then it is discharged at a certain discharge speed by switch over from this input voltage Vin to a reference voltage Vref. During this discharge, the output voltage of the integration circuit 110 is compared with a predetermined threshold voltage (0V, for example) in a comparator 112 to detect a timing at which the output voltage of the integration circuit 110 exceeds the threshold voltage.

A switch control circuit 114 controls the counting operation of a counter 116 on the basis of the output of the comparator 112 and the timing of the switch over between the input voltage Vin and the reference voltage Vref which are applied to the integration circuit 110 alternately. An A/D converted signal of the input voltage Vin can be obtained from a count value of the counter 116 representing a length of a charging period during which the input voltage Vin is applied to the integration circuit 110, and a count value of the counter 116 representing a discharging period between the moment at which the reference voltage Vref is applied to the integration circuit 110 and the moment at which the value of the output voltage of the comparator 112 changes.

In short, since the charged voltage of the capacitor C is an average value of the input voltage Vin during the charging period, and the length of the discharging period is proportional to the charged voltage, A/D converted signal of the input voltage Vin can be determined from these count values of the counter 116. In this double integration type A/D converter 101, the length of the sampling period (the time period necessary to perform a single A/D converting process) has to be set larger than the sum of a length of a discharging period when the input voltage Vin takes its maximum and a certain length of the charging period.

As shown in FIG. 6A, the sequential comparison type A/D converter circuit 102 includes a resistor ladder 120 having resistors ladder-connected with one another, a switching section 122 switching the connection state of the resistor ladder 120, and a comparator 124 comparing an input voltage Vin with a voltage which the resistor ladder 120 serving as a voltage divider circuit generates as a comparison voltage Vref by dividing down a constant voltage (5V in this embodiment).

The sequential comparison type A/D converter circuit 102 performs a first-time comparison in a state where the switching section 122 sets the connection state of the resistor ladder 120 such that a voltage equal to a half of the full scale voltage is generated as a comparison voltage Vref(1). If the input voltage Vin is larger than the comparison voltage Vref(1), the sequential comparison type A/D converter circuit 102 performs a second-time comparison in a state where the switching section 122 sets the connection state of the resistor ladder 120 such that a quarter of the full scale voltage becomes a new comparison voltage Vref(2). On the other hand, if the input voltage Vin is smaller than the comparison voltage Vref(1), the sequential comparison type A/D converter circuit 102 performs a second-time comparison in a state where the switching section 122 sets the connection state of the resistor ladder 120 such that the sum of the current comparison voltage Vref(1) and a quarter of the full scale voltage becomes a new comparison voltage Vref(2).

Thereafter, if the input voltage Vin is larger than a comparison voltage Vref(k) in a k-th time comparison, the sequential comparison type A/D converter circuit 102 performs a (k+1)-th time comparison in a state where the switching section 122 sets the connection state of the resistor ladder 120 such that the sum of a previous comparison voltage Vref (k−1) and a $\frac{1}{2}^{k+1}$ of the full scale voltage becomes a new comparison voltage Vref (k+1). On the other hand, if the input voltage Vin is smaller than the comparison voltage Vref (k) in the k-th time comparison, the sequential comparison type A/D converter circuit 102 performs a (k+1)-th time comparison in a state where the switching section 122 sets the connection state of the resistor ladder 120 such that the sum of the current comparison voltage Vref (k) and a $\frac{1}{2}^{k+1}$ of the full scale voltage becomes a new comparison voltage Vref (k+1).

An A/D converted signal of the input voltage Vin is determined from the connection state of the ladder resistor 120 (opening and closing states of switches of the switching section 122) in a final comparison. Accordingly, the sequential comparison type A/D converter circuit 102 has to repeat the comparison operation by the number of times equal to the number of bits constituting the A/D converted signal. In this sequential comparison type A/D converter circuit 102, a comparison time for one comparison operation is equal to the sum of a time needed to set the switching section 122 and a time needed for the output of the comparator 124 to stabilize after the comparison voltage applied to the comparator 124 is changed. Accordingly, the length of the sampling period (the time period necessary to perform a single A/D converting process) has to be set larger than the comparison time multiplied by the number of the comparison operations performed during the single A/D converting process.

As shown in FIG. 6B, the parallel type A/D converter circuit 103 includes a voltage dividing section 130 generating comparison voltages by equally dividing the full scale voltage into $n=2^m$ parts, and a comparison section 132 having n comparators CM1 to CMn for comparing the input voltage Vin with the comparison voltages individually when it is necessary to A/D convert the input voltage Vin into m-bit digital signal.

An A/D converted signal of the input voltage Vin is determined from the output states (high or low) of the comparators CM1 to CMn. Accordingly, the length of the sampling period (the time period needed to perform a single A/D converting process) in the parallel type A/D converter circuit 103 can be set as small as the time needed for the outputs of the comparators CM1 to CMn to stabilize after the comparison voltage applied to these comparators is changed. Hence, the parallel type A/D converter 103 is capable of performing the A/D conversion at high speed.

As clear from the above explanation, each of the double integral type A/D converter circuit 101, the sequential comparison type A/D converter circuit 102, and the parallel type A/D converter circuit 103 has at least one comparator applied with the input voltage Vin at one input terminal thereof. During a test on such A/D converters, it is necessary to confirm that each comparison circuit operates normally for the entire range of the input voltage Vin.

More specifically, when the A/D converter circuit is configured to output an m-bit digital signal as the A/D converted input voltage, it is necessary to repeat a procedure where a voltage applied to the A/D converter circuit as the input voltage Vin is changed stepwise by an amount equal to $1/2^m$ of the full scale of the input voltage Vin, and the m-bit digital signal outputted from the A/D converter circuit is checked as to whether it matches the voltage applied to the A/D converter circuit each time the voltage applied to the A/D converter circuit is changed.

Accordingly, the number of voltage steps to be checked increases exponentially with the increase of the resolution of the A/D converter circuit, that is, with the increase of the number m (the number of the bits forming the A/D converted signal). Incidentally, to test the A/D converter circuits 101 to 103, it is necessary to change the voltage applied to them stepwise at a resolution higher than at least the resolutions of the A/D converters 101 to 103. Accordingly, to test the A/D converters 101 to 103, an expensive evaluation device having a quite high accuracy has been needed.

In addition, since the sampling time has to be set long in the dual integration type A/D converter circuit 101 and the sequential comparison type A/D converter circuit 102, a time needed to perform the test becomes extremely long when they have high resolution.

The parallel type A/D converter 103, which can operate at high speed, also has a problem in that, when the number of bits forming the A/D converted signal is increased, for example, increased by one, the number of the comparators included therein has to be increased twice, and accordingly the entire circuit scale thereof is almost doubled. This make it difficult for the parallel type A/D converter to have high resolution.

SUMMARY OF THE INVENTION

The present invention provides a method of testing an A/D converter circuit including a pulse delay circuit constituted by a plurality of cascade-connected delay units each of which delays an input pulse signal by a time depending on a value of an input voltage to be A/D converted, and an encoding circuit configured to count the number of the delay units through which the input pulse signal passes within a predetermined measuring time and to output a digital signal representing the counted number as an A/D converted digital signal of the input voltage, the method comprising the steps of:

setting the A/D converter circuit in a test mode where the measuring time is set at a test-use sampling period shorter than a real-use sampling period used when the A/D converter circuit is in actual use;

applying the input pulse signal to each of serial delay blocks each of which is constituted by a predetermined number of the delay units; and determining good and bad of the A/D converter circuit on the basis of digital signals outputted from the encoding circuit representing the numbers of the delay units through which the input pulse signal has passed within the test-use sampling period within each of the serial delay blocks.

The present invention also provides a method of testing an A/D converter circuit including a ring delay circuit constituted by a plurality of delay units connected in a ring each of which delays an input pulse signal by a time depending on a value of an input voltage to be A/D converted, a counter counting the number of times that the input pulse signal travels around the ring delay circuit within a predetermined measuring time, and an encoding circuit configured to detect a position of the input pulse signal within the ring delay circuit and to output a digital signal representing the detected position as lower-order bits of an A/D converted signal of the input voltage and a digital signal representing the number of times counted by the counter as higher-order bits of the A/D converted signal, the method comprising the steps of:

setting the A/D converter circuit in a test mode where the measuring time is set at a test-use sampling period shorter than a real-use sampling period used when the A/D converter circuit is in actual use;

applying the input pulse signal to the ring delay circuit; and determining good and bad of the ring delay circuit on the basis of a digital signal outputted from the encoding circuit representing a position of the input pulse signal after a lapse of the test-use sampling period within the ring delay circuit.

The present invention also provides a method of testing an A/D converter circuit including a ring delay circuit constituted by a plurality of delay units connected in a ring each of which delays an input pulse signal by a time depending on a value of an input voltage to be A/D converted, a counter counting the number of times that the input pulse signal travels around the ring delay circuit within a predetermined measuring time, and an encoding circuit configured to detect a position of the input pulse signal within the ring delay circuit and to output a digital signal representing the detected position as lower-order bits of an A/D converted signal of the input voltage and a digital signal representing the number of times counted by the counter as higher-order bits of the A/D converted signal, the method comprising the steps of:

setting a flip-flop circuit constituting the encoding circuit and a flip-flop circuit constituting the counter at desired values by use of a scan path formed by a series of the flip-flop circuits, respectively; and determining good and bad of the counter and the encoding circuit on the basis of digital signals outputted from the encoding circuit representing values set in the flip-flop circuits, respectively.

The present invention also provides an A/D converter circuit comprising:

a pulse delay circuit constituted by a plurality of cascade-connected delay units each of which delays an input pulse signal by a time depending on a value of an input voltage to be A/D converted; and an encoding circuit configured to count the number of the delay units through which the input pulse signal passes within a predetermined measuring time and to output a digital signal representing the counted number as an A/D converted digital signal of the input voltage;

wherein the delay units are divided into a predetermined number of serial delay blocks including a predetermined number of the delay units, each of the delay blocks being headed by a multi-input delay unit.

The present invention also provides an A/D converter circuit comprising:

a ring delay circuit constituted by a plurality of delay units connected in a ring each of which delays an input pulse signal by a time depending on a value of an input voltage to be A/D converted;

a counter counting the number of times that the input pulse signal travels around the ring delay circuit within a predetermined measuring time;

an encoding circuit configured to detect a position of the input pulse signal within the ring delay circuit and to output a digital signal representing the detected position as lower-order bits of an A/D converted signal of the input voltage and a digital signal representing the number of times counted by the counter within the measuring time as higher-order bits of the A/D converted signal; and a test clock circuit configured to supply a test clock as a substitute of the input pulse signal to the counter.

According to the present invention, it is possible to test a high resolution A/D converter circuit in a short time at low cost.

REFERRED EMBODIMENTS OF THE INVENTION

First Embodiment

Figure 1A:
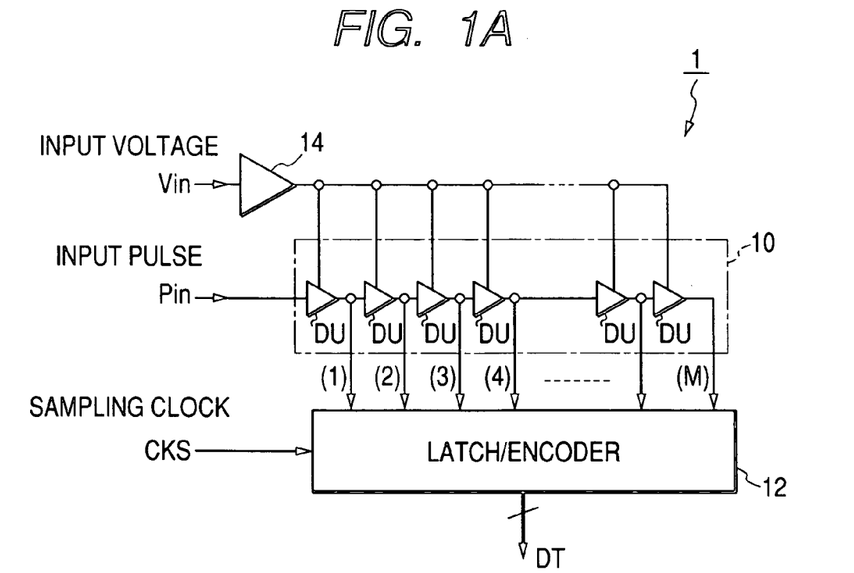
FIG. 1A is a diagram showing a structure of an A/D converter circuit according to a first embodiment of the invention.

FIG. 1A is a diagram showing a structure of an A/D converter circuit 1 according to a first embodiment of the invention.

As shown in this figure, the A/D converter circuit 1 includes a pulse delay circuit 10 constituted by cascade-connected $M(=2^{p+q}$, p and q being positive integers) delay units DU each of which is for delaying an input pulse Pin by a predetermined delay time, and a latch/encoder 12 for detecting (latching) a position of the input pulse Pin within the pulse delay circuit 10 in synchronization with the rising of a sampling clock CKS, and converting the detected position into a digital signal DT formed by a predetermined number of bits which represents what number of the delay unit DU the input pulse Pin has reached.

Figure 1B:
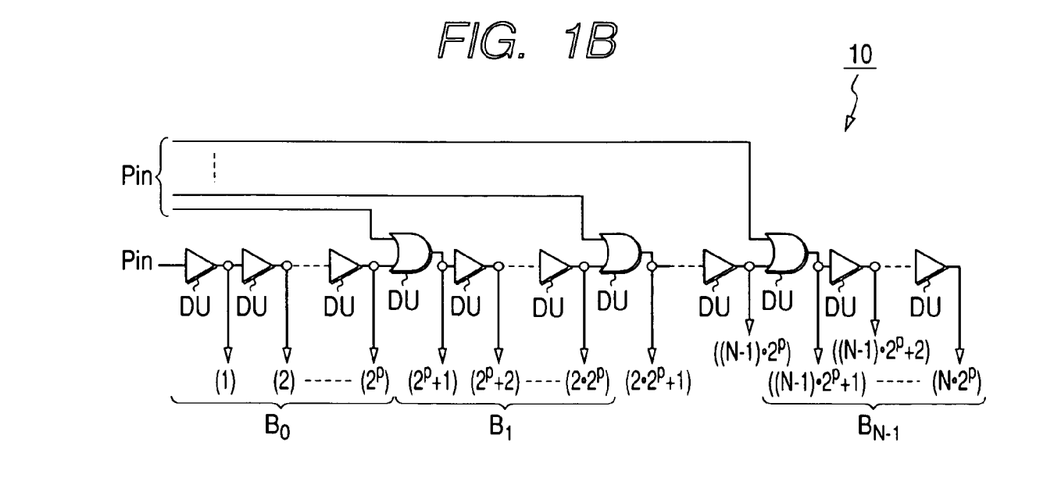
FIG. 1B is a diagram showing a structure of a pulse delay circuit of the A/D converter circuit according to the first embodiment of the invention.

As shown in FIG. 1B, the pulse delay circuit 10 constituted by the delay units DU which may be a gate circuit such as an inverter are configured such that the $(i \times 2^p+1)$-th stage delay unit DU (i=1, 2, ..., N−1; $N=2^q$) serves as a two-input OR circuit receiving an output of the preceding delay unit DU and the input pulse Pin, and the other delay units DU serve as a one-input buffer circuit.

In FIG. 1A, and FIG. 1B, the numbers in parentheses represent the numbers assigned to the delay units DU. Here, the groups each of which includes the successive $2^p$ delay units DU headed by the first stage delay unit DU(1) or the $(i \times 2^p+1)$-th stage delay unit DU($i \times 2^p+1$) are named as delay blocks $B_i$ (i=0 to N−1).

Each delay unit DU is applied with, as a drive voltage, an input voltage Vin to be A/D converted through a buffer 14. The delay time of each delay unit DU depends on the value of the input voltage Vin. Accordingly, the number of the delay units DU which the input pulse Pin passes through within a cycle period of the sampling clock CKS, or sampling period TS is proportional to the value of the input voltage.

The input pulse Pin is supplied only to the first stage delay unit DU(1), and the sampling clock CKS is supplied to the latch/encoder 12 after a lapse of the sampling period TS from the time of supplying the input pulse Pin to the first stage delay unit DU(1). In consequence, a digital signal DT representing the value of the input voltage Vin is outputted from the latch/encoder 12.

Figure 2A:
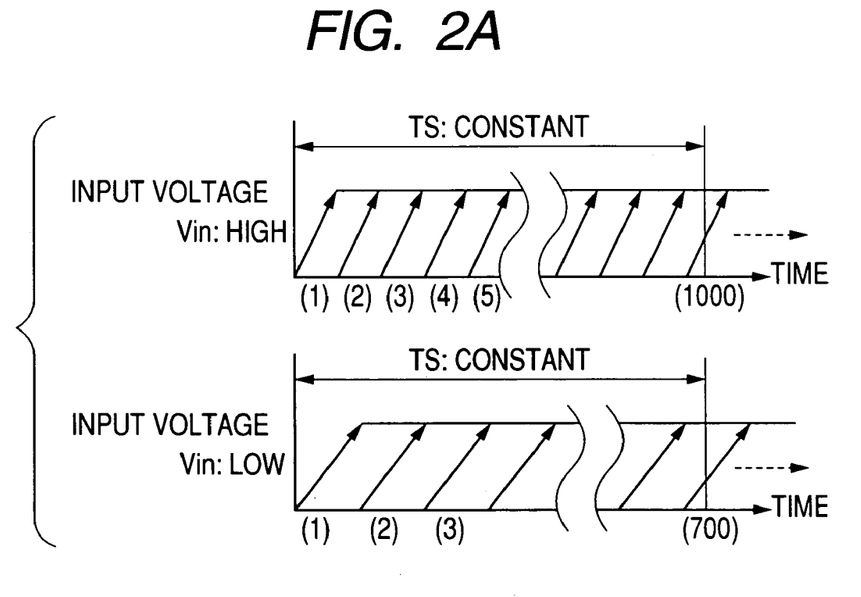
FIG. 2A is a explanatory view for explaining the operation of the A/D converter circuit according to the first embodiment of the invention.
Figure 2B:
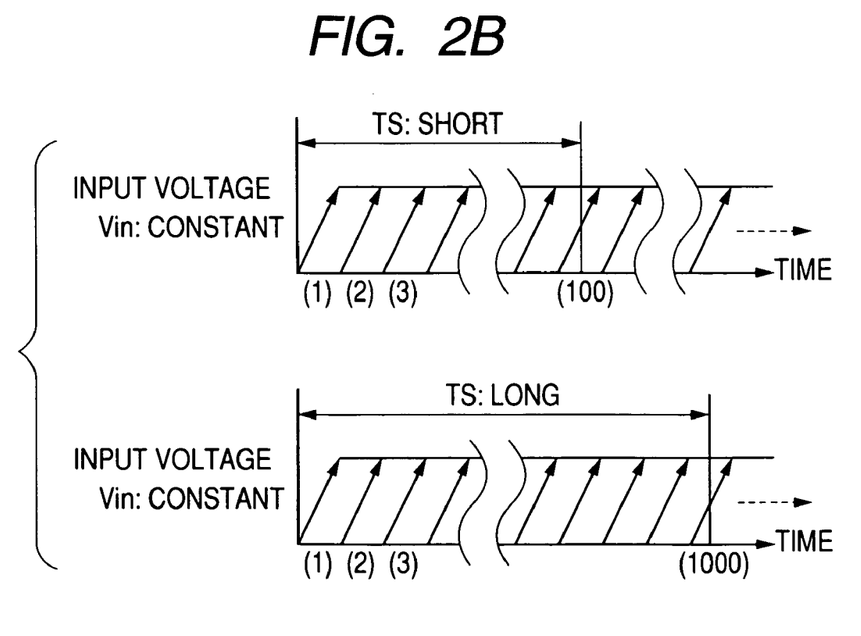
FIG. 2B is a explanatory view for explaining the operation of the A/D converter circuit according to the first embodiment of the invention.

FIG. 2A shows temporal variations of the output voltages of the delay units DU when the input pulse Pin travels within the pulse delay circuit 10 for a case where the input voltage Vin is high and for a case where the input voltage Vin is low. FIG. 2B shows temporal variations of the output voltages of the delay units DU when the input pulse Pin travels within the pulse delay circuit 10 for a case where the sampling period is short and for a case where the sampling period is long.

As seen from FIG. 2A, when the sampling period TS is constant, as the input voltage Vin increases, the number of the delay units DU which the input pulse Pin passes through within one sampling period TS increases, because the delay time of each delay unit DU becomes shorter. On the other hand, as the input voltage Vin reduces, the number of the delay units DU which the input pulse Pin passes through within one sampling period TS reduces, because the delay time of each delay unit DU becomes longer.

Thus, when the sampling period TS is constant, the output (digital signal DT) of the latch/encoder 12 becomes an A/D converted signal varying depending on the value of the input voltage Vin.

As seen from in FIG. 2B, even when the value of the input voltage Vin does not change, and accordingly the delay time of each delay unit DU does not change, if the sampling period TS is shortened, the number of the delay units DU which the input pulse Pin passes through within the sampling period TS reduces. On the other hand, if the sampling period TS is lengthened, the number of the delay units DU which the input pulse Pin passes through within the sampling period TS increases.

As understood from the above explanation, if the sampling period TS is lengthened, the number of bits (the number of voltage steps) constituting the digital signal DT outputted from the latch/encoder 12 increases, and accordingly the resolution of the digital signal DT is improved.

Next, the procedure of testing the A/D converting circuit 1 is explained. Here, the sampling period set for actual use is called as real-use sampling period TSr, and a mode where the A/D converting circuit 1 operates with this real-use sampling period TSr is called as a real mode. And the sampling period set for testing purpose is called as test-use sampling period TSt, and a mode where the A/D converting circuit 1 operates with this test-use sampling period TSt is called as a test mode.

When the threshold voltage (an input voltage needed to invert the output voltage level) of each delay unit DU is Vth, the delay time Td of each delay unit DU is given by the following equation (1)

$$Td = \frac{A \cdot Vin}{(Vin - Vth)^\alpha} \quad (1)$$

where A and $\alpha$(=1.4 to 1.8) are constants depending on a semiconductor process used.

As clear from the equation (1), the delay time TD is reduced as the input voltage Vin increases. When the measuring time (sampling period) is Ts (=1/fs), the A/D converted digital signal DT representing the number of the delay units which the input pulse signal has passed through within the measuring time is given by the following equation (2).

$$DT = \frac{TS}{Td} = \frac{TS \cdot (Vin - Vth)}{A \cdot Vin} \quad (2)$$

As clear from the equation (2), the value of the digital signal DT increases as the measuring time TS is increased. That is, if the measuring time TS is increased, since the same input voltage Vin is represented by the increased number of voltage steps, the resolution of the A/D conversion can be improved.

Accordingly, when the measuring time is set at a test-use sampling period shorter than a real-use sampling period used when the A/D converter circuit is in actual use, although the resolution of the A/D conversion is lowered, the A/D converter circuit can perform the A/D conversion normally.

The real-use sampling period TSr may be set to a time needed for the input pulse Pin to pass through all the delay units DU constituting the pulse delay circuit 10 when the input voltage Vin takes its maximum within a predetermined voltage range. The test-use sampling period TSt may be set to a time needed for the input pulse Pin to pass through all the delay units DU ($2^p$ delay units) constituting one delay block when the input voltage Vin takes its maximum within the predetermined voltage range.

In the test mode, a test voltage generated by an evaluation device is applied to the delay circuit 10 through the buffer 14 as the input voltage Vin under such a condition that the input pulse Pin is applied to not only the first stage delay unit DU(1), but also to all the two-input delay units DU(i×$2^p$+1).

The digital signal DT outputted from the latch/encoder 12 at this time is divided into N digital signals each of which includes p bits corresponding to N delay blocks Bi each of which includes $2^p$ delay units DU. If all of the N digital signals match the value of the test voltage (or all of the values of the N digital signals are within a certain expected value range), then it is determined that the A/D converter circuit 1 functions normally for the current test voltage.

This procedure is repeated for all of the $2^p$ voltage steps. As explained above, in this embodiment, the pulse delay circuit 10 includes a certain number of the two-input type delay units receiving the output of the preceding delay unit and the input pulse Pin, which are spaced from each other to include therebetween a certain number of the one-input type delay unit receiving only the output of the preceding delay unit.

In the test mode, the A/D converter circuit 1 operates with the test-use sampling period TSr shorter than the real-use sampling period TSr in a state where the input pulse Pin is applied to not only the first stage delay unit DU(1), but also to all the two-input delay units DU(i×$2^p$+1) at the same time.

The A/D converter circuit 1 of this embodiment can be tested much faster than the conventional A/D converter circuits, because all of delay blocks $B_0$ to $B_{N-1}$ can be tested at once together with the latch/encoder 12.

Accordingly, when the A/D converter circuit 1 is implemented as a part of a system LSI, the productivity of the system LSI can be improved greatly.

Incidentally, the evaluation device is required to be capable varying the test voltage applied to the A/D converter circuit 1 as the input voltage Vin at a resolution higher than the resolution of the A/D converted signal outputted from the latch/encoder 12. If the test of the A/D converter circuit 1 is performed in a state where the A/D converter circuit 1 is set in the real mode, that is, in a state where the A/D converter circuit 1 operates under actual use condition, a very expensive evaluation device having a very high resolution is needed, because the number of bits of the A/D converted digital signal DT is p+q, and accordingly the resolution of the A/D converted digital signal DT is as high as $1/2^{p+q}$.

In this embodiment, the A/D converter circuit 1 is tested in the test mode where the number of bits of the A/D converted digital signal DT is p, and the resolution of the A/D converted digital signal DT is therefore as low as $1/2^p$. Accordingly, with this embodiment, an inexpensive evaluation device can be used.

Assume that the pulse delay circuit 10 is constituted by $2^{20}$ (about 1,000,000) delay units DU for converting the input voltage Vin into a 20-bit digital signal DT and each delay block Bi is constituted by $2^{10}$ (about 1,000) delay units DU (accordingly, p=q=10), and that real-use sampling period TSr is 1 ms and the test-use sampling period TSt is 1 μs.

In this case, the time needed for the A/D converter circuit 1 set in the test mode to perform a single A/D converting operation is 1/1000(=TSt/TSr) of that set in the real mode, and the total number of the A/D converting operations to be repeated during the test is $2^{10}$ (equal to the number of the delay blocks), which is about 1/1000 of that in the case where the A/D converting operation is performed for each of the $2^{20}$ voltage steps (equal to the number of the delay units DU). Accordingly, in this case, the time needed to test the A/D converter circuit 1 is reduced to 1/1000×1/1000=1/1,000,000.

Also, in this case where the test is performed on the A/D converter circuit 1 operating in the test mode, the resolution required of the evaluation device may be of the order of 1 mV ($1/2^{10}$ V) which is 1000 times coarser than that in a case where the test is performed on the A/D converter circuit 1 operating in the real mode where the resolution required of the evaluation device has to be of the order of 1 μV ($1/2^{20}$ V).

If the test-use sampling period Tst is further shortened (to 1/10,000 or 1/100,000 of the real-use sampling period Tsr, for example), the resolution of the evaluation device can be further coarsened to further shorten the testing time.

Second Embodiment

Figure 3:
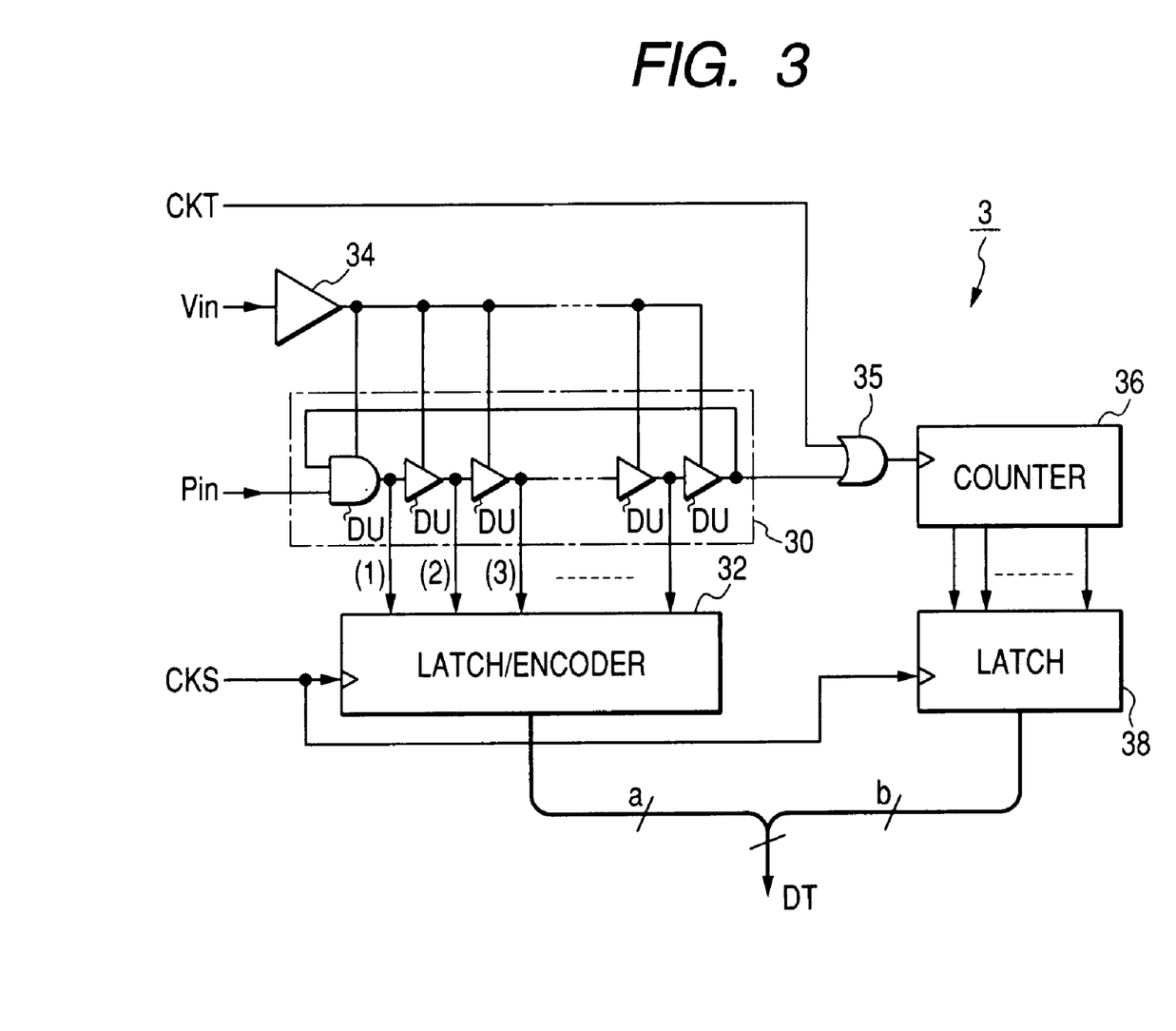
FIG. 3 is a diagram showing a structure of an A/D converter circuit according to a second embodiment of the invention.

FIG. 3 is a diagram showing a structure of an A/D converter circuit 3 according to a second embodiment of the invention. As shown in this figure, the A/D converter circuit 3 includes a ring delay circuit 30 having a ring delay line formed by $2^a$ (a being an integer between 3 and 10, for example) delay units DU coupled in a ring through which the input voltage Vin can circulates, a and a latch/encoder 32 for detecting (latching) a position of the input pulse Pin within the ring delay circuit 30 in synchronization with the rising of the sampling clock CKS, and converting the detected position into an a-bit digital signal DT which represents what number of the delay unit DU the input pulse Pin exists in.

The ring delay circuit 30 has such a structure that the first stage delay unit DU is constituted by an AND gate having two input terminals one of which serves as an trigger terminal, and the other of which is connected to the output terminal of a final stage delay unit DU. Each delay unit DU is applied with the input voltage Vin to be A/D converted as a driving voltage through a buffer 34.

The A/D converter circuit 3 further includes a b-bit counter 36, an OR circuit 35 serving as a test clock supply circuit supplying the counter 36 with one of the output (circulating clock) of the final stage delay unit DU of the ring delay circuit 30 and a test clock CKT supplied from outside, and a latch circuit 38 for latching the count value of the counter 36 in synchronization with the rising of the sampling clock CKS.

In actual use, the A/D converter circuit 3 operates in such a state that the counter 36 is supplied with the circulation clock from the ring delay circuit 30 as an operation clock in order to count the number of times that the circulation clock has traveled around the ring delay line.

And the A/D converter circuit 3 generates, each time the sampling clock CKS rises after a lapse of the sampling period TS from the time at which the input pulse Pin was inputted to the A/D converter circuit 3, the (a+b) bit digital signal DT representing the value of this input voltage Vin, the (a+b) bit digital signal being formed by lower-order a bits outputted from the latch/encoder 32 representing the position of the input pulse Pin within the ring delay circuit 30, and high-order b bits outputted from the latch circuit 38 representing the number of times that the input pulse has traveled around the ring.

On the other hand, when instead of the input pulse Pin, the test clock CKT is supplied to the A/D converter circuit 3, the counter 36 operates to count the test clock CKT independently of the operation of the ring delay circuit 30.

Next, the procedure of testing the A/D converter circuit 3 having the above described structure is explained. Here, the sampling period set for actual use is called as real-use sampling period TSr, and a mode where the A/D converter circuit 3 operates with this real-use sampling period TSr is called as a real mode. Likewise, the sampling period set for testing purpose is called as test-use sampling period TSt, and a mode where the A/D converter circuit 3 operates with this test-use sampling period TSr is called as a test mode.

The real-use sampling period TSr may be set to a time needed for the counter 36 counts up to its maximum countable value when the input voltage Vin takes its maximum within a predetermined voltage range. The test-use sampling period TSt may be set to a time needed for the input pulse Pin to pass through all the delay units DU constituting the ring delay circuit 30, that is, a time for the input pulse Pin to travel around the ring when the input voltage Vin takes its maximum within the predetermined voltage range.

In the test mode, a test voltage generated by an evaluation device is applied to the ring delay circuit 30 through the buffer 34 as the input voltage Vin. At this time, the input pulse Pin is inputted to the first stage delay unit DU (1). And the sampling clock CKS that rises after a lapse of the test-use sampling period TSt from a time at which the input pulse Pin was inputted is supplied to the latch/encoder 32.

If it results that the lower a-bit of the output of the latch/encoder circuit 32 matches the value of test voltage generated by the evaluation device (or is within a certain expected value range depending on the value of the test voltage), then it is determined that the A/D converter circuit 3 functions normally for this test voltage.

This procedure is repeated for all the $2^a$ steps of the test voltage representing the lower a-bit. In this way, the functions of the ring delay circuit 30 and the latch/encoder circuit 32 are checked.

Next, the input voltage Vin and the input pulse Pin are interrupted, and instead, the test clock CKT is inputted to the counter 36 through the OR circuit 35 in such a way that a clock pulse of the sampling clock CKS is inputted to the latch circuit 38 each time a clock pulse of the test clock CKT is inputted, so that the count value of the counter 36 is loaded to the latch circuit 38 for each count value.

If the higher b-bit of the output of the latch circuit 38 matches the number of the clock pulses of the test clock CKT having been inputted, it is determined that the counter 36 and the latch circuit function normally for the this value. This procedure is repeated for all of the count values of the counter 36 (that is, repeated $2^b$ times).

As explained above, the A/D converter circuit 3 of this embodiment has such a configuration that the number of the delay units DU through which the input pulse Pin passes within the sampling period TS is counted by the combination of the ring delay circuit 30 and the counter 36 instead of the pulse delay circuit 10, and the counter 36 can operate on the test clock CKT supplied from the outside dependently of the ring delay circuit 30.

Accordingly, with the A/D converter circuit 3 of this embodiment, the test can be performed easily, and the reliability of the test is improved.

Moreover, with the second embodiment using the ring delay circuit 30, the number of the delay units DU as well as the time needed to perform one A/D converting operation in the test mode can be reduced significantly compared to the first embodiment. Accordingly, the time required to perform the test can be further shortened, and also an inexpensive evaluation device having a relatively low resolution can be used to reduce the cost of performing the test.

To give an example, the number of the delay units DU can be reduced by half by increasing the number of the count bits of the counter 36 by one, if the number of the bits of the digital signal DT is the same with the first embodiment.

Although the input pulse Pin is inputted only to the first stage delay unit DU in this embodiment, it is possible that some of the delay units DU are of the two-input type, and the input pulse Pin is inputted also to the two-input type delay units DU.

Third Embodiment

Figure 4:
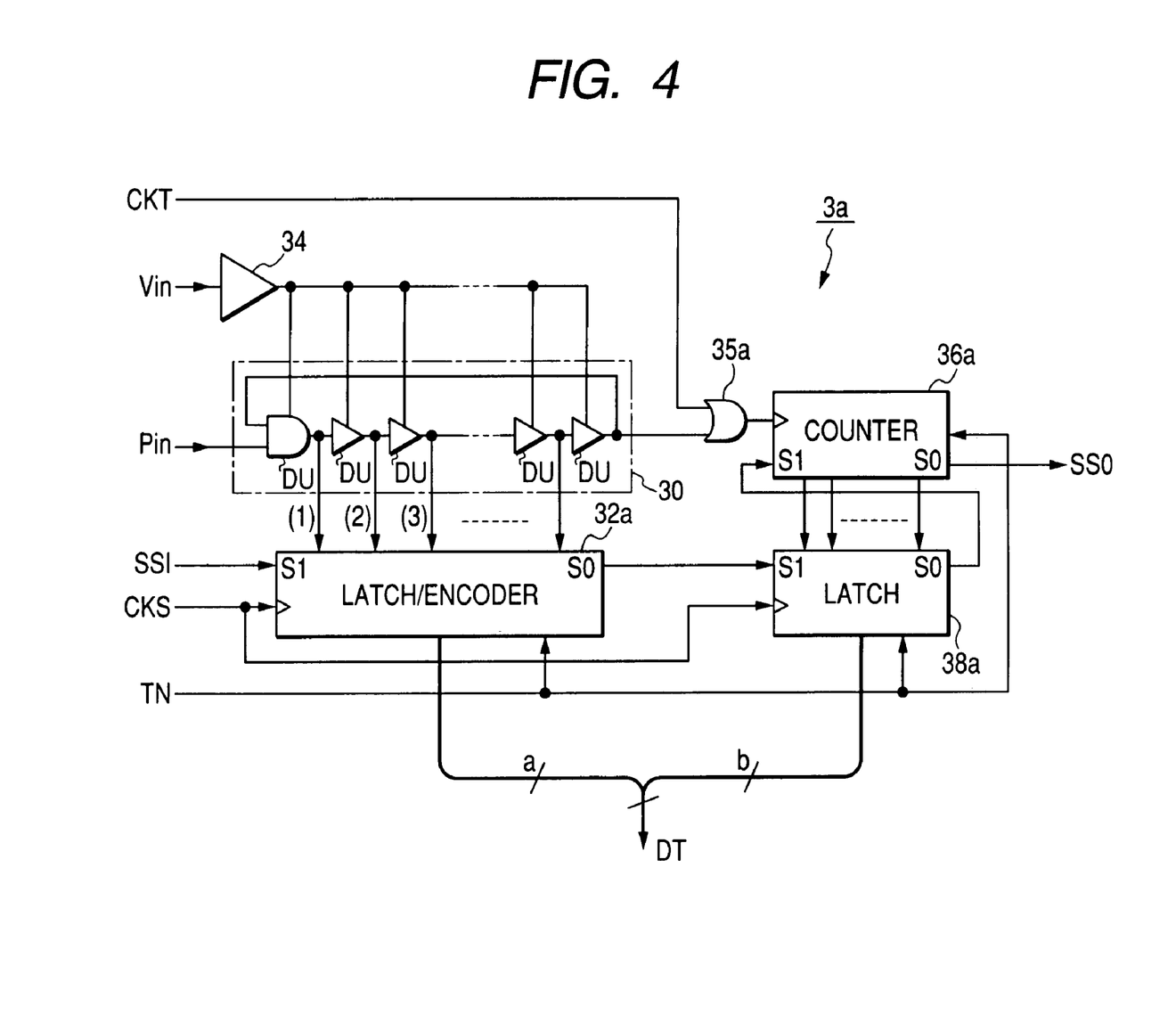
FIG. 4 is a diagram showing a structure of an A/D converter circuit according to a third embodiment of the invention.

FIG. 4 is a diagram showing a structure of an A/D converter circuit 3a according to a third embodiment of the invention. The third embodiment is different from the second embodiment in the structures of the latch/encoder 32, counter 36, and latch circuit 38. Accordingly, the following explanation focuses on the difference between the second and third embodiment.

In the third embodiment, a flip-flop circuit of the latch/encoder 32a for latching the output of the ring delay circuit 30, a flip-flop circuit of the latch circuit 38a for latching the output of the counter 36a, and a flip-flop circuit of the counter 36a are series-connected to form the so called "scan path".

The latch/encoder 32a, the latch circuit 38a, and the counter 36a are supplied with a mode designation signal TN from outside. When the mode designation signal TN designates a normal mode, the latch/encoder 32a, the latch circuit 38a, and the counter 36a operate in the same way with the above described second embodiment. On the other hand, when the mode designation signal TN designates a test mode, the serial bits in the scan path (the series of the flip-flop circuits) are shifted by one in synchronization with the sampling clock CKS. Accordingly, by supplying a serial input signal SSI to the scan path, it becomes possible to set each of the flip-flop circuits at a desired value, and to read the value of the flip-flop circuits as a serial output signal SSO.

Next, the procedure of the test for determining good and bad of the A/D converter circuit 3a having the above described structure is explained. At the beginning, the flip-flop circuits of the latch/encoder 32a and the latch circuit 38a are set to any set values, respectively, through the scan path. Subsequently, these set values and the digital signal DT formed by the outputs of the latch/encoder 32a and the latch circuit 38a are compared to check the operation of the latch/encoder 32a and the latch circuit 38a.

Thereafter, the same procedure as that of the test in the second embodiment is performed. As clear from the above explanation, since the latch/encoder 32a and the latch circuit 38a can be checked separately from the ring delay circuit 30 and the counter 36a by the provision of the scan path, the reliability of the test can be further improved.

In this embodiment, the scan path is used for setting the latch/encoder 32a and the latch circuit 38a at desired values, however, it may be used to read the latched value of the ring delay circuit 30 and the counter 36a, or may be used as a substitute for the test clock.

It should be noted that, for determining the good and bad of a combinational circuit constituting the counter 36a, it is effective to perform the so called scan test where the combinational circuit is run in real use (real mode) for one clock period after being set at a certain value by the scan path, and then the computation result (the output of the combinational circuit) is read through the scan path to be compared with an expected value.

The above explained preferred embodiments are exemplary of the invention of the present application which is described solely by the claims appended below. It should be understood that modifications of the preferred embodiments may be made as would occur to one of skill in the art.

What is claimed is:

1. A method of testing an A/D converter circuit including a pulse delay circuit constituted by a plurality of cascade-connected delay units each of which delays an input pulse signal by a time depending on a value of an input voltage to be A/D converted, and an encoding circuit configured to count the number of said delay units through which said input pulse signal passes within a predetermined measuring time and to output a digital signal representing said counted number as an A/D converted digital signal of said input voltage, said method comprising the steps of:

setting said A/D converter circuit in a test mode where said measuring time is set at a test-use sampling period shorter than a real-use sampling period used when said A/D converter circuit is in actual use;

applying said input pulse signal to each of serial delay blocks each of which is constituted by a predetermined number of said delay units; and determining good and bad of said A/D converter circuit on the basis of digital signals outputted from said encoding circuit representing the numbers of said delay units through which said input pulse signal has passed within said test-use sampling period within each of said serial delay blocks.

2. A method of testing an A/D converter circuit including a ring delay circuit constituted by a plurality of delay units connected in a ring each of which delays an input pulse signal by a time depending on a value of an input voltage to be A/D converted, a counter counting the number of times that said input pulse signal travels around said ring delay circuit within a predetermined measuring time, and an encoding circuit configured to detect a position of said input pulse signal within said ring delay circuit and to output a digital signal representing said detected position as lower-order bits of an A/D converted signal of said input voltage and a digital signal representing said number of times counted by said counter as higher-order bits of said A/D converted signal, said method comprising the steps of:

setting said A/D converter circuit in a test mode where said measuring time is set at a test-use sampling period shorter than a real-use sampling period used when said A/D converter circuit is in actual use;

applying said input pulse signal to said ring delay circuit; and determining good and bad of said ring delay circuit on the basis of a digital signal outputted from said encoding circuit representing a position of said input pulse signal after a lapse of said test-use sampling period within said ring delay circuit.

3. The method according to claim 2, wherein, instead of said input pulse signal circulating in said ring delay circuit, a test clock is counted by said counter in said test mode, and said method further comprises the step of determining good and bad of said counter on the basis of a digital signal outputted from said encoding circuit representing a count value of said counter.

4. A method of testing an A/D converter circuit including a ring delay circuit constituted by a plurality of delay units connected in a ring each of which delays an input pulse signal by a time depending on a value of an input voltage to be A/D converted, a counter counting the number of times that said input pulse signal travels around said ring delay circuit within a predetermined measuring time, and an encoding circuit configured to detect a position of said input pulse signal within said ring delay circuit and to output a digital signal representing said detected position as lower-order bits of an A/D converted signal of said input voltage and a digital signal representing said number of times counted by said counter as higher-order bits of said A/D converted signal, said method comprising the steps of:

setting a flip-flop circuit constituting said encoding circuit and a flip-flop circuit constituting said counter at desired values by use of a scan path formed by a series of said flip-flop circuits, respectively; and determining good and bad of said counter and said encoding circuit on the basis of digital signals outputted from said encoding circuit representing values set in said flip-flop circuits, respectively.

5. An A/D converter circuit comprising:

a pulse delay circuit constituted by a plurality of cascade-connected delay units each of which delays an input pulse signal by a time depending on a value of an input voltage to be A/D converted; and an encoding circuit configured to count the number of said delay units through which said input pulse signal passes within a predetermined measuring time and to output a digital signal representing said counted number as an A/D converted digital signal of said input voltage;

wherein said delay units are divided into a predetermined number of serial delay blocks including a predetermined number of said delay units, each of said delay blocks being headed by a multi-input delay unit capable of receiving said input pulse signal from a preceding one of said delay units and an external test pulse signal, and capable of outputting one of said received input pulse signal and said received test-use pulse signal to a succeeding one of said delay units.

6. An A/D converter circuit comprising:

a ring delay circuit constituted by a plurality of delay units connected in a ring each of which delays an input pulse signal by a time depending on a value of an input voltage to be A/D converted;

a counter counting the number of times that said input pulse signal travels around said ring delay circuit within a predetermined measuring time;

an encoding circuit configured to detect a position of said input pulse signal within said ring delay circuit and to output a digital signal representing said detected position as lower-order bits of an A/D converted signal of said input voltage and a digital signal representing said number of times counted by said counter within said measuring time as higher-order bits of said A/D converted signal; and a test clock supply circuit configured to supply a test clock as a substitute of said input pulse signal to said counter.

7. The A/D converter circuit according to claim 6, wherein a flip-flop circuit constituting said encoding circuit and a flip-flop circuit constituting said counter are series connected to form a scan path.

* * * * *